United States Patent
Tsai et al.

(10) Patent No.: US 7,355,209 B2
(45) Date of Patent: Apr. 8, 2008

(54) LIGHT EMITTING DIODE AND METHOD MAKING THE SAME

(75) Inventors: Tzong-Liang Tsai, Hsinchu (TW);
Chih-Li Chiang, Taichung (TW);
Chih-Sung Chang, Hsinchu (TW);
Way-Jze Wen, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 85 days.

(21) Appl. No.: 11/316,437

(22) Filed: Dec. 22, 2005

(65) Prior Publication Data
US 2006/0186417 A1 Aug. 24, 2006

(30) Foreign Application Priority Data
Feb. 5, 2005 (TW) .............................. 94104057 A

(51) Int. Cl.
*H01L 27/15* (2006.01)
(52) U.S. Cl. .......................................... 257/79; 257/81
(58) Field of Classification Search ................ 257/79, 257/81
See application file for complete search history.

(56) References Cited

U.S. PATENT DOCUMENTS

| 6,794,690 | B2 | 9/2004 | Uemura |
| 6,797,987 | B2 | 9/2004 | Chen |
| 6,812,502 | B1 | 11/2004 | Chien et al. |
| 2004/0182914 | A1 | 9/2004 | Venugopalan |
| 2005/0045907 | A1* | 3/2005 | Song et al. ................. 257/103 |

FOREIGN PATENT DOCUMENTS

JP 2004-253763 9/2004

* cited by examiner

*Primary Examiner*—Roy Karl Potter
(74) *Attorney, Agent, or Firm*—Snell & Wilmer L.L.P.

(57) ABSTRACT

A light emitting diode and the method of the same are provided. The light emitting diode includes a light emitting structure and a metal reflective layer. The light emitting structure includes two semiconductor layers and an active layer. Oxide elements are added into the metal reflective layer to improve the adhesion between the reflective layer and the light emitting structure. Additionally, a transparent contact layer can be formed between the light emitting structure and the reflective layer in order to enhance the luminance efficiency.

11 Claims, 5 Drawing Sheets

LIGHT EMITTING DIODE AND METHOD MAKING THE SAME

CROSS-REFERENCE TO RELATED APPLICATIONS

This application claims priority to Taiwan Patent Application No. 94104057 entitled "Light Emitting Diode and Method of the Same," filed on Feb. 5, 2005, which is incorporated herein by reference and assigned to the assignee herein.

FIELD OF INVENTION

The present invention generally relates to a light emitting diode and method of the same, and more particularly, to a light emitting diode and method of the same with improved adhesion between the reflective layer and the semiconductor layer.

BACKGROUND OF THE INVENTION

For improving the luminance efficiency, the prior light emitting diode usually includes a reflective layer. As shown in FIG. 1, an n-type semiconductor layer 104, an active layer 106 and a p-type semiconductor 108 are formed successively on a transparent substrate 102. The light generated from the active layer 106 is emitted through the transparent substrate 102 into the air. To improve luminance, the light toward p-type semiconductor 108 needs to be reflected and radiated out through the substrate 102. Typically, the material of the reflective layer 116 is selected from metals with high reflectivity, such as Ag, Au or Al. This configuration has been disclosed in U.S. Pat. Nos. 6,794,690 and 6,812,502 and US Publication No. 2004/0182914.

However, peelings may occur between the reflective layer 116 and the p-type semiconductor 108 during a lift-off step due to poor adhesion between the metal layer and the p-type semiconductor 108.

In addition, when the reflective layer is made of Ag, there arises a current leakage problem that are caused by migration of silver, and therefore performance of the light emitting diode is lowered.

Current spreading is important to luminance and uniformity of the light emitting diode. Since the current is from the p-type semiconductor layer 108 to the active layer 106 for generating light, the current spreading in the p-type semiconductor layer 108 is a significant factor for good luminance efficiency. Accordingly, the current spreading has to be improved for high luminance efficiency.

Therefore, there is a need to provide a light emitting diode and its fabricating method to enhance the adhesion between the metal reflective layer and the p-type semiconductor layer, and furthermore to improve luminance and performance of the light emitting diode.

SUMMARY OF THE INVENTION

One aspect of the present invention is to provide a light emitting diode and method of forming the same. Oxygen is added to the light emitting diode for improving the adhesion between the reflection layer and the semiconductor layer according to the present invention.

The present invention provides a light emitting diode including a light emitting structure and a metal reflector. The light emitting structure includes an active layer and two semiconductor layers with different dopants. The light emitting structure emits light as current is injected. The metal reflective layer reflects the light from the light emitting structure and includes oxygen elements ($>10^{15}$ atoms/cm$^3$, and preferably about $10^{20}$-$10^{22}$ atoms/cm$^3$) to improve the adhesion between the metal reflective layer and the semiconductor layer.

The above-mentioned metal reflective layer can be a single-layer structure, or a multiple-layer structure including a first layer with oxygen elements ($>10^{15}$ atoms/cm$^3$, and preferably about $10^{20}$-$10^{22}$ atoms/cm$^3$) and a second layer without oxygen elements.

The above-mentioned light emitting diode further includes a transparent contact layer between the light emitting structure and the reflective layer to improve the current spreading for the luminous efficiency. The transparent contact layer includes a material selected from metals as Nickel, Gold, Silver, Chromium, Platinum or Palladium, metal oxides such as Indium Zinc Oxide (IZO), Indium Oxide, Zinc Oxide (ZnO), Indium Tin Oxide (ITO), Tin Oxide, Antimony Doped Tin Oxide (ATO), Antimony Oxide, Antimony Zinc Oxide (AZO), Cadmium Tin Oxide (CTO) or Cadmium Oxide, or metal nitrides as Titanium Nitride (TiN), Tungsten Nitride (WN) or Titanium Tungsten Nitride (TiWN).

The present invention also provides a method of fabricating a light emitting diode, including the following steps: providing a substrate; forming a light emitting structure on the substrate; forming a metal reflective layer on the light emitting structure; and adding oxygen elements ($>10^{15}$ atmos/cm$^3$, preferably with about $10^{20}$-$10^{22}$ atmos/cm$^3$) during the formation of the metal reflective layer.

The above-mentioned step of forming the metal reflective layer includes a step of forming a single-layer structure or includes the following steps to form a multiple-layer structure: forming a first metal single-layer structure with oxygen elements ($>10^{15}$ atmos/cm$^3$, preferably with about $10^{20}$-$10^{22}$ atmos/cm$^3$); and forming a second metal single-layer structure without oxygen element.

The above-mentioned steps of forming the light emitting diode further include the following steps: forming a transparent contact layer between the light emitting structure and the metal reflective layer, wherein the transparent contact layer comprises a material selected from metals such as Nickel, Gold, Silver, Chromium, Platinum or Palladium, metal oxides such as Indium Zinc Oxide (IZO), Indium Oxide, Zinc Oxide (ZnO), Indium Tin Oxide (ITO), Tin Oxide, Antimony Doped Tin Oxide (ATO), Antimony Oxide, Antimony Zinc Oxide (AZO), Cadmium Tin Oxide (CTO) or Cadmium Oxide, or metal nitrides as Titanium Nitride (TiN), Tungsten Nitride (WN) or Titanium Tungsten Nitride (TiWN).

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

The present invention provides a light emitting diode and method of the same. For better understanding, please read the following description in conjunction with the accompanying drawings.

Figure 1:
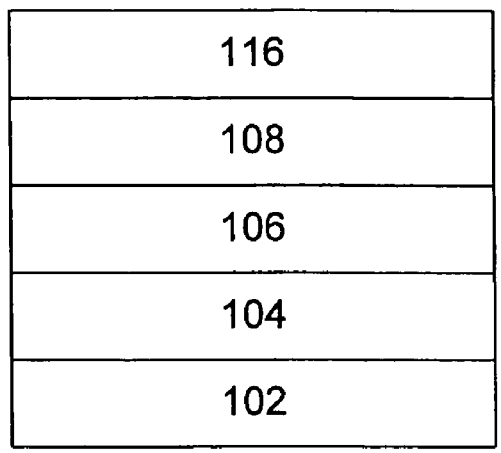
FIG. 1 illustrates a cross-sectional view of a prior light emitting diode.
Figure 2:
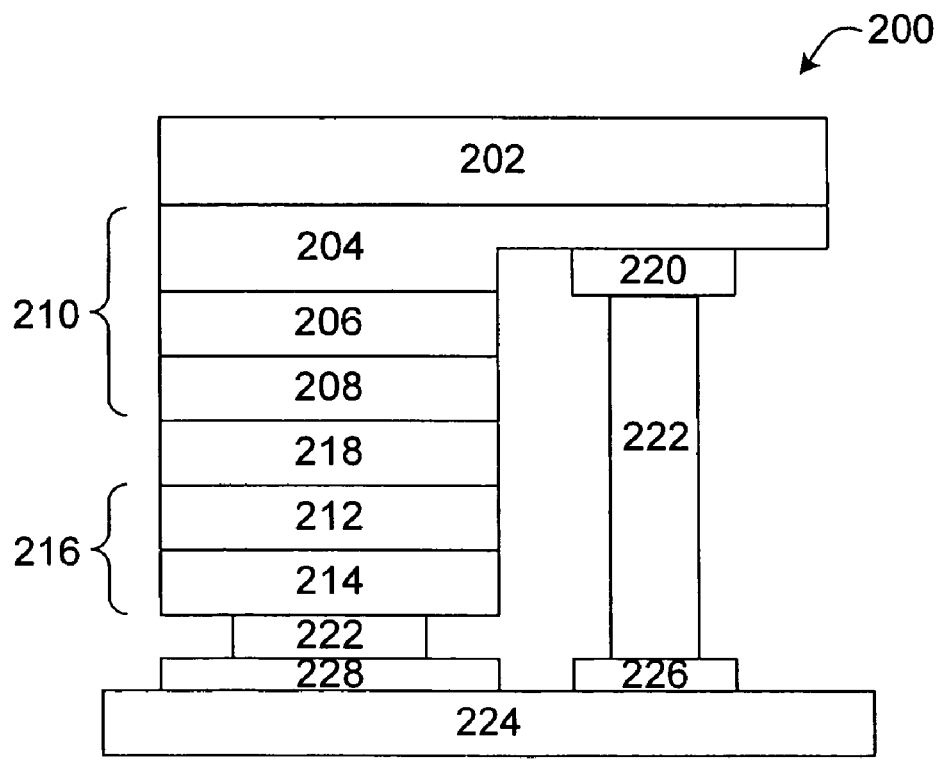
FIG. 2 illustrates a cross-section view of the first embodiment of the present invention.
Figure 3:
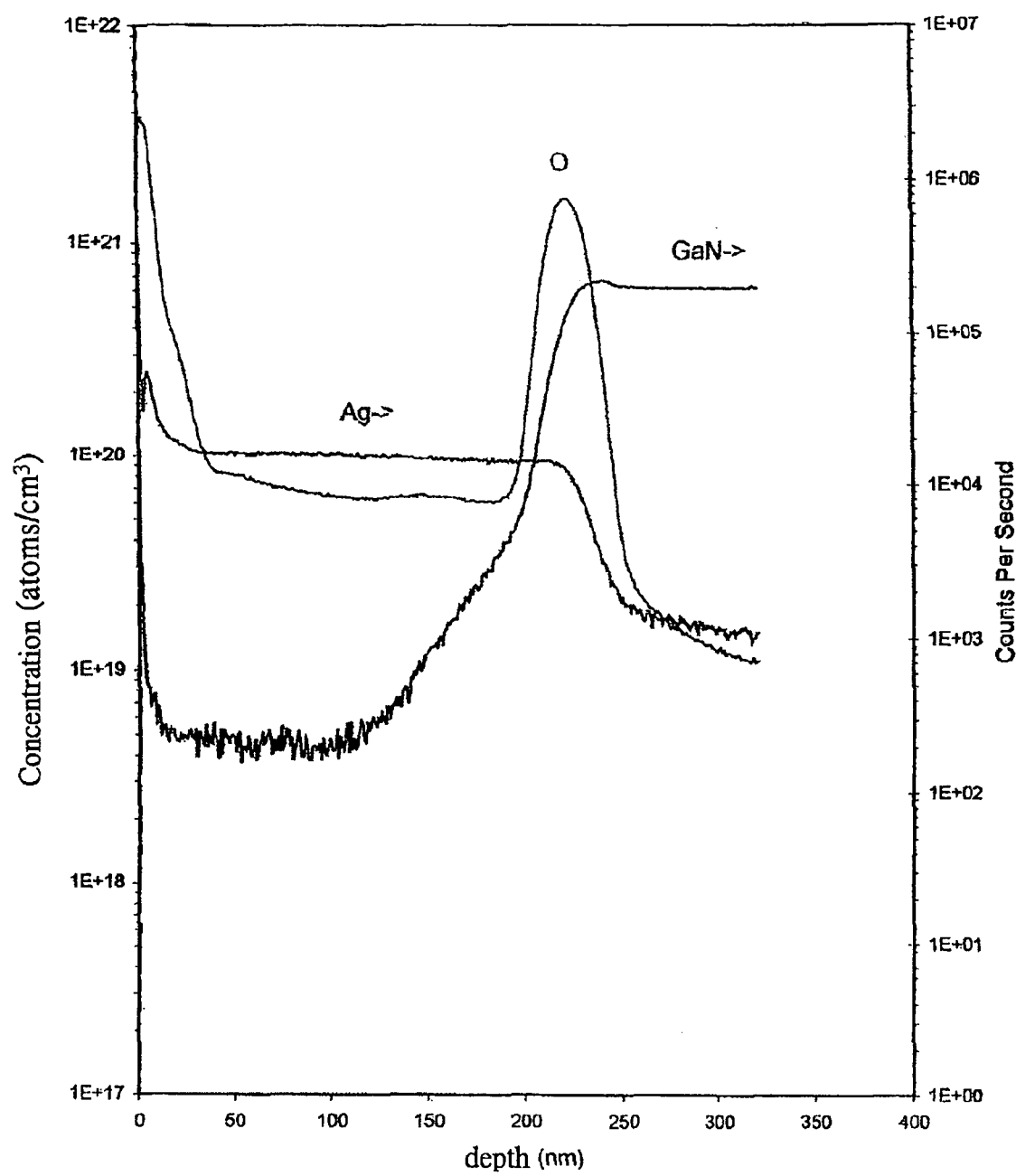
FIG. 3 illustrates a SIMS analysis of the metal reflective layer in the first embodiment of the present invention.

FIG. 2 illustrates the cross-section view of a flip-chip light emitting diode 200 according to the first embodiment of the present invention. The light emitting diode 200 includes a transparent substrate 202, a light emitting structure 210 and a metal reflective layer 216. The transparent substrate 202 can be a grown substrate or an adhered substrate, and includes a material selected from sapphire, glass, GaP, GaN, AlN or SiC having the transparent property. The light emitting structure 210 includes two different doped types of the semiconductor layers 204 and 208, and an active layer 206. In this embodiment, the layer 204 is an n-type semiconductor layer and the layer 208 is a p-type semiconductor layer. The metal reflective layer 216 reflects the light generated from the active layer 206 for improving luminance efficiency, wherein the metal reflective layer 216 includes oxygen elements and a material selected from Ag, Au, Al, Cr, Rh, Pt and Ti having high reflectivity. FIG. 3 illustrates a SIMS analysis of the amount of the oxygen elements in the metal reflective layer 216, which shows that concentration of the oxygen elements is higher than $10^{15}$ atoms/cm$^3$ and preferably about $10^{20}$-$10^{22}$ atoms/cm$^3$ in this embodiment.

The light emitting diode 200 further includes an electrode 202 touching the n-type semiconductor layer 204. The electrode 202 connects with the conductive regions 226 and 228 on a submount substrate 224 by an adhesive layer 222, which may use conventional flip-chip LED bonding techniques well known to those skilled in the art.

Figure 4:
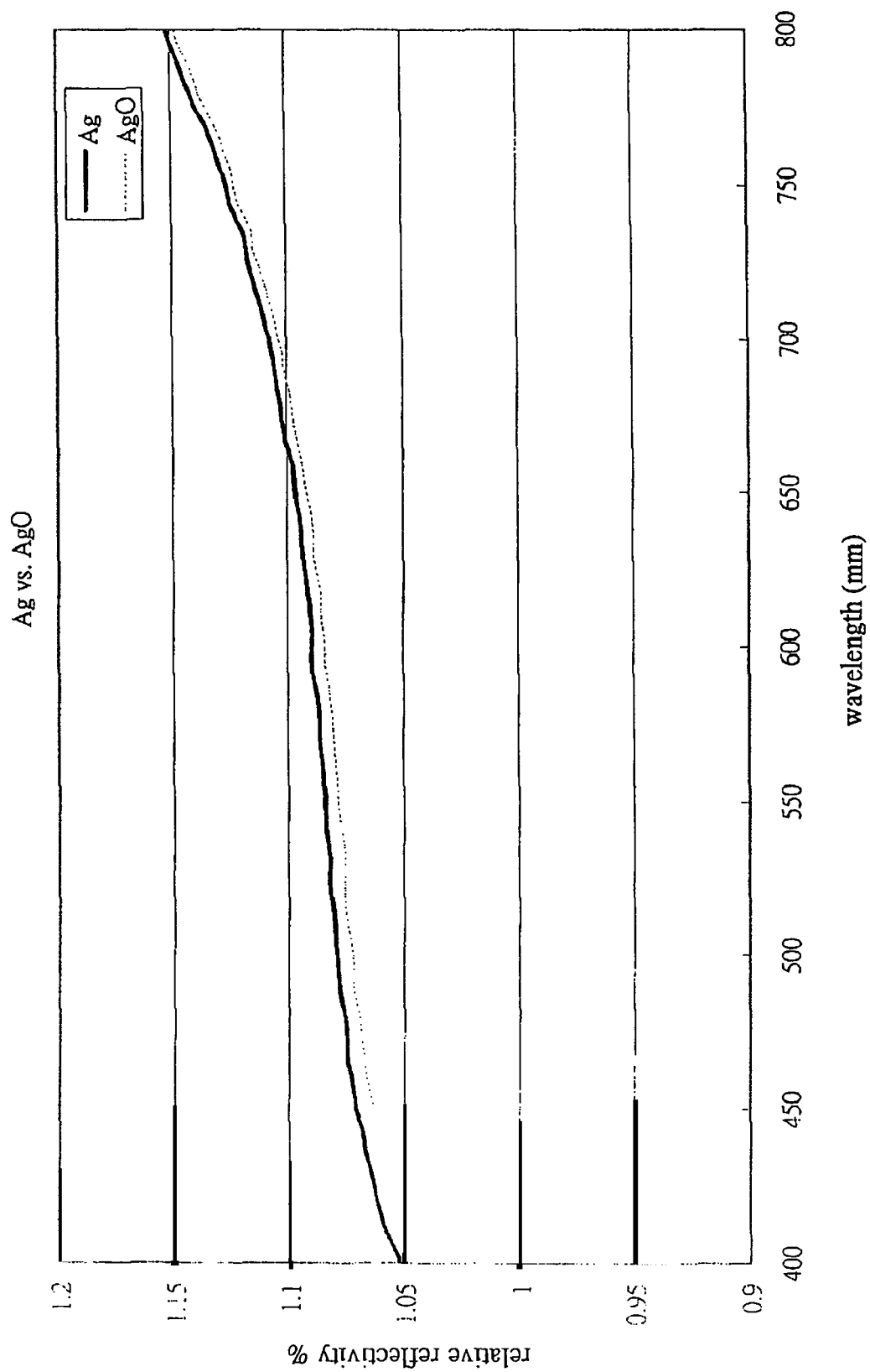
FIG. 4 illustrates the relative reflectivities of the metal reflective layer prior and posterior to the addition of the oxygen elements respectively.

By adding oxygen elements into the metal reflective layer 216, the problem of poor adhesion between the p-type semiconductor layer and the metal layer is solved, yet the added oxygen elements (>$10^{15}$ atoms/cm$^3$, and preferably about $10^{20}$-$10^{22}$ atoms/cm$^3$) makes very little impact on the reflectivity of the metal reflective layer 216. For example, FIG. 4 illustrates the relative reflectivities of a silver reflective layer prior and posterior to the addition of the oxygen elements respectively, with a difference between these two reflectivities under 1%.

The metal reflective layer 216, which includes oxygen elements, can be either a multiple-layer structure or a single layer structure. In this embodiment, the metal reflective layer 216 includes a first reflective layer 212 with oxygen elements (>$10^{15}$ atmos/cm$^3$, preferably about $10^{20}$-$10^{22}$ atmos/cm$^3$). The metal reflective layer 216 further includes a second reflective layer 214 with no oxygen element. The preferred materials of the first reflective layer 212 and the second reflective layer 214 are Ag, Au, Al, Cr, Rh, Pt, Ti or the like. Since the forward voltage of the second reflective layer 214 is lower than that of the first reflective layer 212, the contact resistance is lowered.

The above-mentioned light emitting diode 200 further includes a transparent contact layer 218 between the metal reflective layer 216 and the p-type semiconductor layer 208. By adding the transparent contact layer 218, the current spreading of the p-type semiconductor layer can be improved and thus the luminance efficiency is enhanced. The transparent contact layer 218 comprises a material selected from metals such as Nickel, Gold, Silver, Chromium, Platinum or Palladium, metal oxides such as Indium Zinc Oxide (IZO), Indium Oxide, Zinc Oxide (ZnO), Indium Tin Oxide (ITO), Tin Oxide, Antimony Doped Tin Oxide (ATO), Antimony Oxide, Antimony Zinc Oxide (AZO), Cadmium Tin Oxide (CTO) or Cadmium Oxide, or metal nitrides as Titanium Nitride (TiN), Tungsten Nitride (WN) or Titanium Tungsten Nitride (TiWN). As described above, the transparent contact layer 218 can improve the current spreading of the p-type semiconductor layer 208 and further enhance the luminance efficiency. In addition, the transparent contact layer 218 can be used as a barrier layer for preventing silver from migrating into the p-type semiconductor layer 208, which can therefore avoid the current leakage.

Figure 5A:
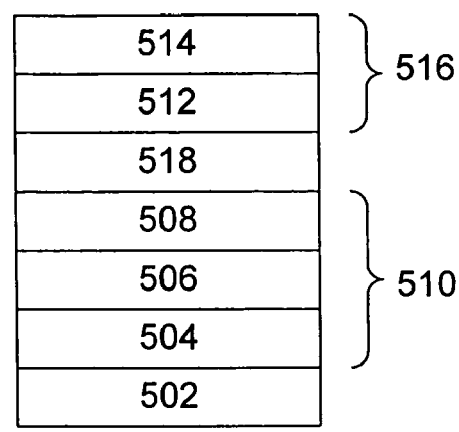
FIGS. 5A to 5C illustrate the steps of fabricating a light emitting diode in accordance with the first embodiment of the present invention.
Figure 5B:
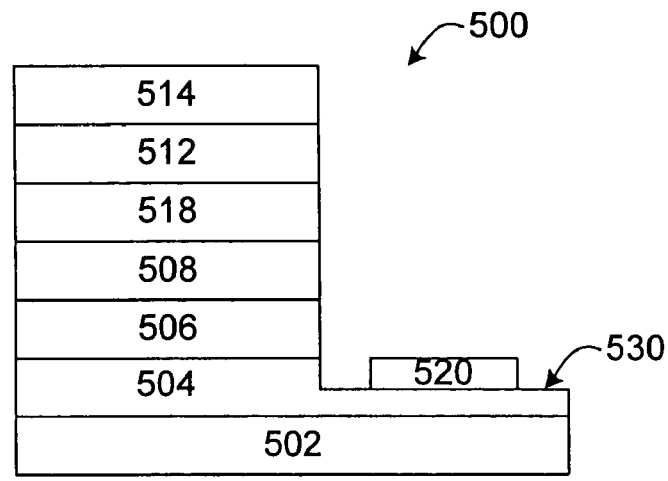
Figure 5C:
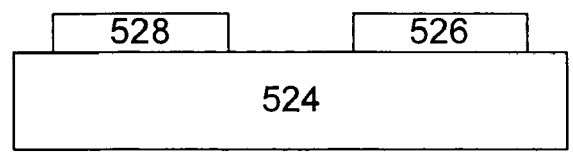

FIGS. 5A to 5C illustrate the steps of fabricating a light emitting diode in accordance with an embodiment of the present invention. With reference to FIG. 5A, a light emitting structure 510 is formed on a substrate 502, wherein the light emitting structure 510 includes an active layer 506 and two different doped types of semiconductor layers 504 and 508. In this embodiment, the semiconductor layer 504 is n-type and the semiconductor layer 508 is p-type. Then, a transparent contact layer 518 is formed on the semiconductor layer 508 and a metal reflective layer 516 is formed on the transparent contact layer 518. The transparent contact layer 518 includes a material selected from metals such as Nickel, Gold, Silver, Chromium, Platinum or Palladium, metal oxides such as Indium Zinc Oxide (IZO), Indium Oxide, Zinc Oxide (ZnO), Indium Tin Oxide (ITO), Tin Oxide, Antimony Doped Tin Oxide (ATO), Antimony Oxide, Antimony Zinc Oxide (AZO), Cadmium Tin Oxide (CTO) or Cadmium Oxide, or metal nitrides as Titanium Nitride (TiN), Tungsten Nitride (WN) or Titanium Tungsten Nitride (TiWN). The metal reflective layer 516 includes oxygen elements (>$10^{15}$ atoms/cm$^3$, and preferably about $10^{20}$-$10^{22}$ atoms/cm$^3$) and a material selected from Silver, Gold, Aluminum, Chromium, Rhodium, Platinum, Titanium or the like. The formation of every layer on the substrate 502 can be made by various process methods well known to those skilled in the art.

The metal reflective layer 516, which includes oxygen elements, can be either a multiple-layer structure or a single layer structure. In this embodiment, the metal reflective layer 516 includes a first reflective layer 512 with oxygen elements (>$10^{15}$ atmos/cm$^3$, preferably about $10^{20}$-$10^{22}$ atmos/cm$^3$). The metal reflective layer 516 further includes a second reflective layer 514 with no oxygen element. The preferred materials of the first reflective layer 512 and the second reflective layer 514 are Ag, Au, Al, Cr, Rh, Pt, Ti or the like. The reflective layer 516 can be formed by adding oxygen elements during the metal evaporation, but also can be formed by other methods. For example, if the oxygen elements are added in the entire process of the formation of the reflective layer 516, a single-layer structure (i.e. the first reflective layer 512) is formed. If the oxygen elements are added only during the first half of the evaporation process, and no oxygen elements is added during the later half of the evaporation process, a double-layer reflective structure 516, including the first reflective layer 512 and the second reflective layer 514 is formed.

Then, with reference to FIG. 5B, the light emitting structure 510, the transparent contact layer 518 and a part of the metal reflective layer 516 are removed to expose a surface 530 of the n-type semiconductor 504. An electrode 520, made of metals with high conductivity (such as Au or Al), is formed on the surface 530 of the n-type semiconductor 540. FIG. 5C shows a submount substrate 524 configured to combine with a flip-chip light emitting diode. The structure 500 in FIG. 5B is reversed and bonded to the submount substrate 524 that aligns with the conductive regions 526 and 528 to form a flip-chip light emitting diode (such as structure 200 in FIG. 2). The bonding can be performed by any known flip-chip bonding methods, such as solder bump.

Figure 6:
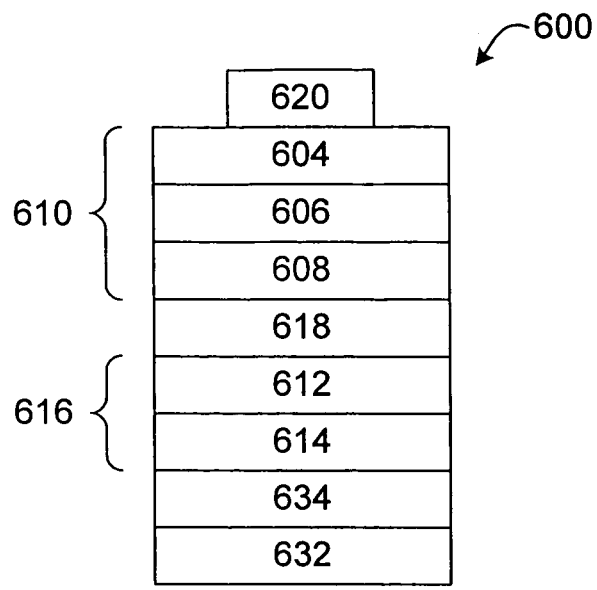
FIG. 6 illustrates a cross-section view of the second embodiment of the present invention.

FIG. 6 illustrates a cross-section view of a thin-film light emitting diode 600 in accordance with the second embodiment of the present invention. The light emitting diode 600 includes a conductivity substrate 632, a metal reflective layer 616 and a light emitting structure 610. The conductivity substrate 632, made of the known material with high conductivity, is adhered to the reflective layer 616 by an adhesion layer 634. The light emitting structure 610 includes two different doped types of the semiconductor layers 604 and 608, and an active layer 606. In this embodiment, the layer 604 is an n-type semiconductor layer and the layer 608 is a p-type semiconductor layer. The metal reflective layer 616 reflects the light generated from the active layer 606 for improving luminance efficiency, wherein the metal reflective layer 616 includes oxygen elements and a material selected from Ag, Au, Al, Cr, Rh, Pt and Ti having high reflectivity.

The above-mentioned light emitting diode 600 further includes an electrode 620 touching the n-type semiconductor layer 604.

By adding oxygen elements into the metal reflective layer 616, the problem of poor adhesion between the p-type semiconductor layer and the meta layer is solved, and the added oxygen elements makes very little impact on the reflectivity of the metal reflective layer 216, as illustrated above.

The metal reflective layer 616, which includes oxygen elements, can be either a multiple-layer structure or a single layer structure. In this embodiment, the metal reflective layer 616 includes a first reflective layer 612 with oxygen elements ($>10^{15}$ atmos/cm$^3$, preferably about $10^{20}$-$10^{22}$ atmos/cm$^3$). The metal reflective layer 616 further includes a second reflective layer 614 with no oxygen element. The preferred materials of the first reflective layer 612 and the second reflective layer 614 are Ag, Au, Al, Cr, Rh, Pt, Ti or the like. Since the forward voltage of the second reflective layer 614 is lower than that of the first reflective layer 612, the contact resistance is lowered.

The above-mentioned light emitting diode 600 further includes a transparent contact layer 618 between the metal reflective layer 616 and the p-type semiconductor layer 608, wherein the transparent contact layer 618 includes a material selected from metals such as Nickel, Gold, Silver, Chromium, Platinum or Palladium, metal oxides such as Indium Zinc Oxide (IZO), Indium Oxide, Zinc Oxide (ZnO), Indium Tin Oxide (ITO), Tin Oxide, Antimony Doped Tin Oxide (ATO), Antimony Oxide, Antimony Zinc Oxide (AZO), Cadmium Tin Oxide (CTO) or Cadmium Oxide, or metal nitrides as Titanium Nitride (TiN), Tungsten Nitride (WN) or Titanium Tungsten Nitride (TiWN). As described above, the transparent contact layer 618 can improve the current spreading of the p-type semiconductor layer 608 and further enhances the luminance efficiency. In addition, the transparent contact layer 618 can be used as a barrier layer for preventing silver from migrating into the p-type semiconductor layer 608, which can therefore avoid the current leakage.

Figures 7A, 7B:
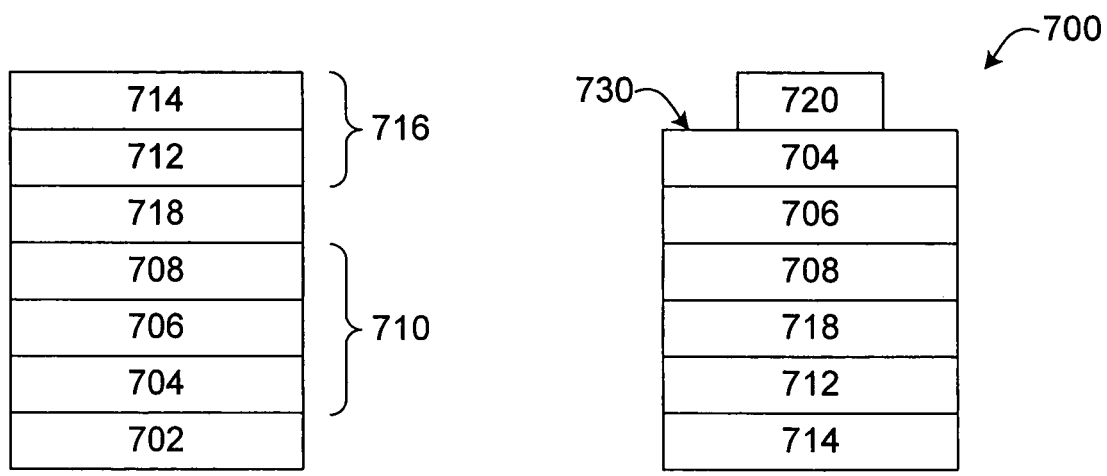
FIGS. 7A to 7C illustrate the steps of fabricating a light emitting diode in accordance with the second embodiment of the present invention.
Figure 7C:
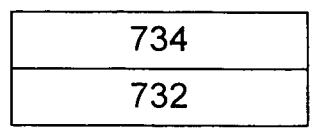

FIGS. 7A to 7C illustrate the steps of fabricating a light emitting diode in accordance with the second embodiment of the present invention. With reference to FIG. 7A, a light emitting structure 710 is formed on a grown substrate 702, wherein the light emitting structure 710 includes an active layer 706 and two different doped types of semiconductor layers 704 and 708. In this embodiment, the semiconductor layer 704 is n-type and the semiconductor layer 708 is p-type. Then, a transparent contact layer 718 is formed on the semiconductor layer 708 and a metal reflective layer 716 is formed on the transparent contact layer 718. The transparent contact layer 718 is selected from Indium Tin Oxide (ITO) or Zinc Oxide (ZnO). The metal reflective layer 716 includes oxygen elements ($>10^{15}$ atoms/cm$^3$, and preferably about $10^{20}$-$10^{22}$ atoms/cm$^3$) and a material selected from Silver, Gold, Aluminum, Chromium, Rhodium, Platinum, Titanium or the like. The formation of every layer on the substrate 702 can be made by various process methods well known to those skilled in the art.

The metal reflective layer 716, which includes oxygen elements, can be either a multiple-layer structure or a single layer structure, which can be formed by adding oxygen elements during the metal evaporation but is not limited to such. In this embodiment, the metal reflective layer 716 includes a first reflective layer 712 with oxygen elements ($>10^{15}$ atmos/cm$^3$, preferably about $10^{20}$-$10^{22}$ atmos/cm$^3$). The metal reflective layer 716 further includes a second reflective layer 714 with no oxygen element. The preferred materials of the first reflective layer 712 and the second reflective layer 714 are Ag, Au, Al, Cr, Rh, Pt, Ti or the like.

Then, with reference to FIG. 7B, the grown substrate 702 is removed. An electrode 720, made of metals with high conductivity (such as Au or Al), is formed on the surface 730 of the n-type semiconductor 740. FIG. 7C shows a conductive substrate 732 configured to combine with a thin-film light emitting diode. The structure 700 in FIG. 7B is bonded to the conductive substrate 732 by an adhesive layer 734 to form a thin-film light emitting diode (such as structure 600 in FIG. 6).

Although specific embodiments have been illustrated and described, it will be obvious to those skilled in the art that various modifications may be made without departing from what is intended to be limited solely by the appended claims.

We claim:

1. A light emitting diode, comprising:

a metal reflective layer with oxygen elements; and
    a light emitting structure touching said metal reflective layer, said light emitting structure comprising a first semiconductor layer, a second semiconductor layer, and an active layer, wherein said first semiconductor layer touches said metal reflective layer, said active layer touches said first semiconductor layer, and said second semiconductor layer touches said active layer.

2. The light emitting diode of claim 1, wherein said metal reflective layer is a single-layer structure, and said single-layer structure comprises a material selected from Gold, Silver, Aluminum, Chromium, Rhodium, Platinum, and Titanium.

3. The light emitting diode of claim 1, wherein said metal reflective layer is a multiple-layer structure comprising:

a first reflective layer touching said first semiconductor layer, said first reflective layer comprising oxygen elements and a material selected from Gold, Silver, Aluminum, Chromium, Rhodium, Platinum, and Titanium; and a second reflective layer with no oxygen element comprising a material selected from Gold, Silver, Aluminum, Chromium, Rhodium, Platinum, and Titanium.

4. The light emitting diode of claim 1, further comprising a transparent contact layer between said first semiconductor layer and said metal reflective layer.

5. The light emitting diode of claim 4, wherein said metal reflective layer is a single-layer structure, and said single-layer structure comprises a material selected from Gold, Silver, Aluminum, Chromium, Rhodium, Platinum, and Titanium.

6. The light emitting diode of claim 4, wherein said metal reflective layer is a multiple-layer structure comprising:

a first reflective layer touching said first semiconductor layer, said first reflective layer comprising oxygen elements and a material selected from Gold, Silver, Aluminum, Chromium, Rhodium, Platinum, and Titanium; and a second reflective layer with no oxygen element comprising a material selected from Gold, Silver, Aluminum, Chromium, Rhodium, Platinum, and Titanium.

7. The light emitting diode of claim 4, wherein said transparent contact layer comprises a material selected from metals as Nickel, Gold, Silver, Chromium, Platinum or Palladium, metal oxides as Indium Zinc Oxide (IZO), Indium Oxide, Zinc Oxide (ZnO), Indium Tin Oxide (ITO), Tin Oxide, Antimony Doped Tin Oxide (ATO), Antimony Oxide, Antimony Zinc Oxide (AZO), Cadmium Tin Oxide (CTO) or Cadmium Oxide, or metal nitrides as Titanium Nitride (TiN), Tungsten Nitride (WN) or Titanium Tungsten Nitride (TiWN).

8. A light emitting diode, comprising:
a metal reflective layer with oxygen elements;
a transparent contact layer touching said metal reflective layer; and
a light emitting structure touching said transparent contact layer, said light emitting structure comprising a first semiconductor layer, a second semiconductor layer, and an active layer, wherein said first semiconductor layer touches said metal reflective layer, said active layer touches said first semiconductor layer, and said second semiconductor layer touches said active layer.

9. The light emitting diode of claim 8, wherein said transparent contact layer comprises a material selected from metals as Nickel, Gold, Silver, Chromium, Platinum or Palladium, metal oxides as Indium Zinc Oxide (IZO), Indium Oxide, Zinc Oxide (ZnO), Indium Tin Oxide (ITO), Tin Oxide, Antimony Doped Tin Oxide (ATO), Antimony Oxide, Antimony Zinc Oxide (AZO), Cadmium Tin Oxide (CTO) or Cadmium Oxide, or metal nitrides as Titanium Nitride (TiN), Tungsten Nitride (WN) or Titanium Tungsten Nitride (TiWN).

10. The light emitting diode of claim 8, wherein said metal reflective layer is a single-layer structure, and said single-layer structure comprises a material selected from Gold, Silver, Aluminum, Chromium, Rhodium, Platinum, and Titanium.

11. The light emitting diode of claim 8, wherein said metal reflective layer is a multiple-layer structure comprising:

a first reflective layer touching said first semiconductor layer, said first reflective layer comprising oxygen elements and a material selected from Gold, Silver, Aluminum, Chromium, Rhodium, Platinum, and Titanium; and a second reflective layer with no oxygen element comprising a material selected from Gold, Silver, Aluminum, Chromium, Rhodium, Platinum, and Titanium.

* * * * *